United States Patent
Eimitsu

(10) Patent No.: US 11,398,825 B1
(45) Date of Patent: Jul. 26, 2022

(54) RECEIVING DEVICE, CONTROL METHOD OF RECEIVING DEVICE, AND MEMORY CONTROLLER

(71) Applicant: Kioxia Corporation, Tokyo (JP)

(72) Inventor: Masatomo Eimitsu, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/410,800

(22) Filed: Aug. 24, 2021

(30) Foreign Application Priority Data

Mar. 18, 2021 (JP) .............................. JP2021-045253

(51) Int. Cl.
| | |
|---|---|
| H03L 7/087 | (2006.01) |
| H03L 7/093 | (2006.01) |
| H03L 7/095 | (2006.01) |
| H03L 7/187 | (2006.01) |
| H03L 7/097 | (2006.01) |
| H03L 7/099 | (2006.01) |

(52) U.S. Cl.
CPC .............. *H03L 7/087* (2013.01); *H03L 7/093* (2013.01); *H03L 7/095* (2013.01); *H03L 7/097* (2013.01); *H03L 7/099* (2013.01); *H03L 7/187* (2013.01)

(58) Field of Classification Search
CPC ........... H03L 7/085–0893; H03L 7/093; H03L 7/099; H03L 7/187
See application file for complete search history.

(56) References Cited

U.S. PATENT DOCUMENTS

| | | | |
|---|---|---|---|
| 7,872,536 B2 | 1/2011 | Mori et al. | |
| 8,067,965 B2 * | 11/2011 | Wei | ........................ H03L 7/099 327/147 |
| 9,225,345 B2 * | 12/2015 | Tong | .................... H03L 7/0992 |
| 2006/0049878 A1 | 3/2006 | Kawabe et al. | |
| 2021/0399732 A1 * | 12/2021 | Lee | ....................... H03L 7/0807 |

FOREIGN PATENT DOCUMENTS

| | | |
|---|---|---|
| JP | 2000-049597 A | 2/2000 |
| JP | 2006-080909 A | 3/2006 |
| JP | 4593669 B2 | 12/2010 |
| JP | 4866707 B | 2/2012 |

* cited by examiner

*Primary Examiner* — Patrick O Neill
(74) *Attorney, Agent, or Firm* — Foley & Lardner LLP

(57) ABSTRACT

A receiving device includes a phase-locked loop (PLL) circuit having a current control oscillator, a phase detector, an integral path, and a proportional path. The current control oscillator can generate an oscillation clock based on a first and second current. The phase detector can acquire a phase detection result based on the oscillation clock and a received signal. The integral path can generate the first current based on an integrated value of the phase detection results and supply the first current to the current control oscillator. The proportional path includes a digital-to-current converter to generate the second current based on the phase detection result and supply the second current to the current control oscillator. The receiving device includes a controller configured to adjust the second current based on frequency-current characteristics of the current control oscillator.

20 Claims, 7 Drawing Sheets

RECEIVING DEVICE, CONTROL METHOD OF RECEIVING DEVICE, AND MEMORY CONTROLLER

CROSS-REFERENCE TO RELATED APPLICATION

This application is based upon and claims the benefit of priority from Japanese Patent Application No. 2021-045253, filed Mar. 18, 2021, the entire contents of which are incorporated herein by reference.

FIELD

Embodiments described herein relate generally to a receiving device, a control method of a receiving device, and a memory controller.

BACKGROUND

Recently, in a semiconductor memory device such as a NAND nonvolatile memory, a reduction in size and an increase in capacity are attempted for three-dimensional structuring. As the capacity of the semiconductor memory device increases, a data transmission rate between a host and a memory controller is required to be increased.

As an interface between these devices, a clock data recovery circuit (CDR) suitable for high-speed serial transmission may be adopted. The CDR recovers a clock from a received signal using a phase-locked loop (PLL) circuit and latches data in the received signal at a timing of the recovered clock.

In order to implement reliable data extraction even when jitter is generated in a received signal, the CDR needs to have sufficiently high jitter tolerance characteristics. To that end, the PLL circuit is desired have satisfactory high frequency characteristics that satisfy high trackability.

However, the PLL circuit may have a problem in that high frequency characteristics deteriorate due to characteristic fluctuation.

DETAILED DESCRIPTION

Embodiments provide a receiving device that can improve reception performance, a control method of a receiving device, and a memory controller.

In general, according to one embodiment, a receiving device includes a clock data recovery circuit including a phase-locked loop (PLL) circuit having a current control oscillator, a phase detector, an integral path, and a proportional path, and configured to receive a signal and recover a clock and data from the received signal based on an output of the PLL circuit. The current control oscillator is configured to generate an oscillation clock based on a first current and second current. The phase detector is configured to acquire a phase detection result based on the oscillation clock and the received signal. The integral path is configured to generate the first current based on an integrated value of the phase detection results and supply the first current to the current control oscillator. The proportional path includes a digital-to-current converter configured to generate the second current based on the phase detection result and supply the second current to the current control oscillator. The receiving device includes a controller configured to adjust the second current based on frequency-current characteristics of the current control oscillator.

Hereinafter, an embodiment will be described in detail with reference to the drawings.

First Embodiment

In the embodiment, CDR jitter tolerance performance is improved by improving high frequency characteristics of a PLL circuit by calibrating a proportional path for the PLL circuit.

Figure 1:
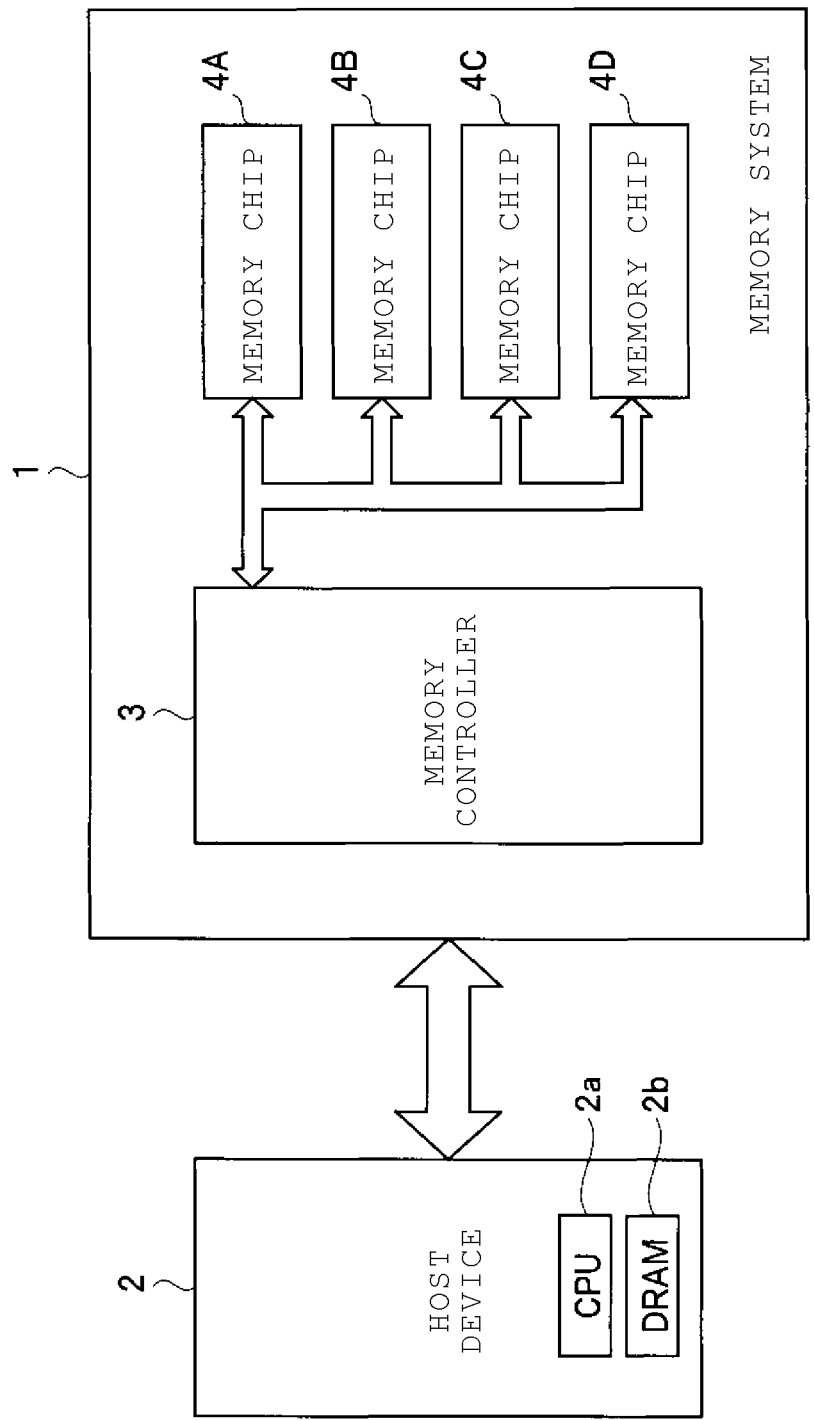
FIG. 1 is a block diagram illustrating a memory system including a receiving device according to an embodiment.
Figure 2:
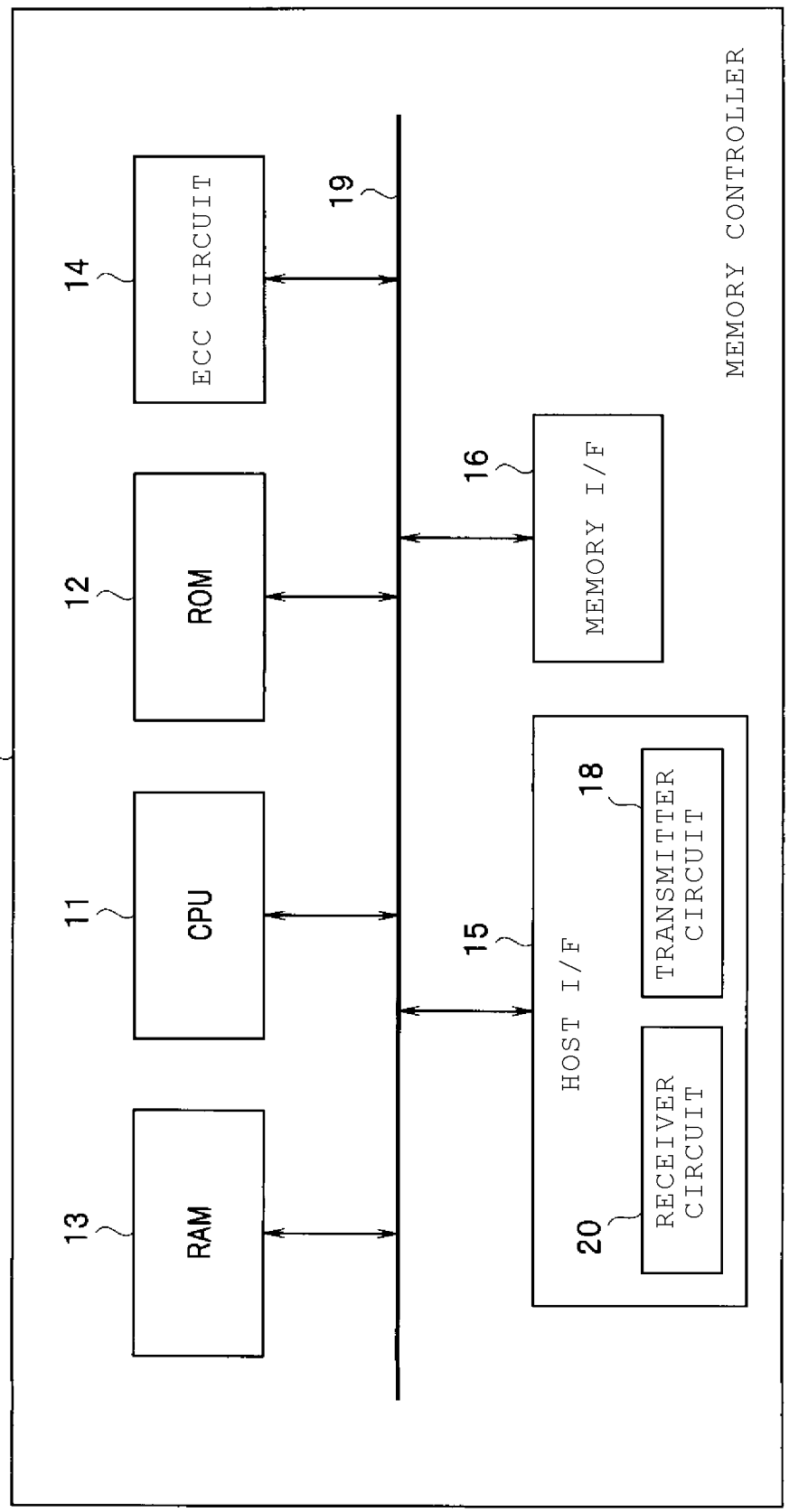
FIG. 2 is a block diagram illustrating one example of a specific configuration of a memory controller in FIG. 1.

FIG. 1 is a block diagram illustrating a memory system including a receiving device according to the embodiment. FIG. 2 is a block diagram illustrating one example of a specific configuration of a memory controller in FIG. 1.

A memory system 1 according to the embodiment includes a memory controller 3 and four memory chips 4A to 4D (hereinafter, when it is not necessary to distinguish between the four memory chips 4A to 4D, the memory chips 4A to 4D will be representatively referred to as "memory chip 4"). Further, the number of the memory chips 4 is not limited to four, and any number of memory chip may be adopted as long as the number is one or more.

The memory system 1 can be connected to a host 2. The host 2 is, for example, an electronic apparatus such as a personal computer, a mobile terminal, an on-board unit, or a server. The host 2 includes a central processing unit (CPU) 2a as a processor, a ROM (not illustrated), and a DRAM 2b. In response to a request from the host 2, the memory system 1 stores user data (hereinafter, simply referred to as "data") from the host 2 into each of the memory chips 4 or reads data stored in each of the memory chips 4 and outputs the read data to the host 2. Specifically, the memory system 1 can write data into each of the memory chips 4 in response to a write request from the host 2, and can read data from each of the memory chips 4 in response to a read request from the host 2.

The memory system 1 may be, for example, a universal flash storage (UFS) device in which the memory controller 3 and a plurality of memory chips 4 are configured as one package, or may be an SSD (solid state drive). FIG. 1 illustrates a state where the memory system 1 is connected to the host 2.

The memory chip 4 is a semiconductor memory device configured with a NAND flash memory or the like capable of storing data in a nonvolatile manner. As illustrated in FIG. 1, the memory controller 3 and each of the memory chips 4 are connected via a NAND bus. The memory controller 3 controls writing of data into the memory chip 4 in accordance with a write request from the host 2. In addition, the memory controller 3 controls reading of data from the memory chip 4 in accordance with a read request from the host 2. The memory controller 3 may control writing and reading of data into and from the memory chip 4 autonomously instead of a request from the host 2.

In FIG. 2, the memory controller 3 includes a CPU 11, a ROM 12, a random access memory (RAM) 13, an error check and correct (ECC) circuit 14, a host interface (I/F) 15, and a memory I/F 16. The CPU 11, the ROM 12, the RAM 13, the ECC circuit 14, the host I/F 15, and the memory I/F 16 are connected to each other via an internal bus 19.

The host I/F 15 includes a receiver circuit 20 that include the receiving device according to the embodiment and a transmitter circuit 18. The receiver circuit 20 receives data from the host 2 and outputs a request or write data in the received data to the internal bus 19. In addition, the transmitter circuit 18 of the host I/F 15 transmits user data read from the memory chip 4, a response from the CPU 11, or the like to the host 2. Further, the host 2 also includes an I/F including a receiver circuit and a transmitter circuit (not illustrated) corresponding to the receiver circuit 20 and the transmitter circuit 18 of the host I/F 15.

The host 2 and the receiver circuit 20 and the transmitter circuit 18 of the host I/F 15 are connected via a particular interface. For example, as the interface, various interfaces such as a parallel interface of embedded multi media card (eMMC), a serial extension interface of peripheral component interconnect express (PCIe), or a high-speed serial interface of M-PHY are adopted.

Based on an instruction of the CPU 11, the memory I/F 16 controls a process of writing user data or the like into each of the memory chips 4 and a process of reading user data or the like from each of the memory chips 4.

The CPU 11 integrally controls the memory controller 3. The CPU 11 is, for example, a central processing unit (CPU) or a micro processing unit (MPU). When the CPU 11 receives a request from the host 2 via the host I/F 15, the CPU 11 executes a control in accordance with the request. For example, the CPU 11 instructs the memory I/F 16 to write user data into each of the memory chips 4 in accordance with a request from the host 2. In addition, the CPU 11 instructs the memory I/F 16 to read user data from each of the memory chips 4 in accordance with a request from the host 2.

The CPU 11 determines a storage area (hereinafter, referred to as "memory area") in each of the memory chips 4 for the user data to be stored in the RAM 13. The user data is stored into the RAM 13 via the internal bus 19. The CPU 11 determines the memory area for, for example, data in units of pages that are units of writing, that is, for page data.

The CPU 11 determines a memory area in each of the memory chips 4 to be written. A physical address is assigned to the memory area of the memory chip 4. The CPU 11 manages the memory area into which the data is to be written using the physical address. The CPU 11 designates the determined physical address of the memory area and instructs the memory I/F 16 to write the user data into the memory chip 4. The CPU 11 manages a correspondence between a logical address of user data (a logical address managed by the host) and a physical address into which the user data is written. When the CPU 11 receives a read request including a logical address from the host, the CPU 11 specifies a physical address corresponding to the logical address, designates the physical address, and instructs the memory I/F 16 to read the user data.

The ECC circuit 14 encodes the user data stored in the RAM 13 and generates a code word. In addition, the ECC circuit 14 decodes a code word read from each of the memory chips 4.

The RAM 13 temporarily stores the user data received from the host 2 until the user data is stored into each of the memory chips 4 or temporarily stores data read from each of the memory chips 4 until the read data is transmitted to the host. The RAM 13 is, for example, a general-purpose memory such as a static random access memory (SRAM) or a dynamic random access memory (DRAM).

FIG. 2 illustrates a configuration example in which the memory controller 3 includes the ECC circuit 14 and the memory I/F 16. However, the ECC circuit 14 may be provided in the memory I/F 16. In addition, the ECC circuit 14 may be provided in each of the memory chips 4.

When the memory controller 3 receives a write request from the host 2, the memory controller 3 operates as follows. The CPU 11 temporarily stores write data into the RAM 13. The CPU 11 reads the data stored in the RAM 13 and inputs the read data to the ECC circuit 14. The ECC circuit 14 encodes the input data and provides a code word to the memory I/F 16. The memory I/F 16 writes the input code word into each of the memory chips 4.

When the memory controller 3 receives a read request from the host 2, the memory controller 3 operates as follows. The memory I/F 16 provides the code word read from each of the memory chips 4 to the ECC circuit 14. The ECC circuit 14 decodes the input code word and stores the decoded data into the RAM 13. The CPU 11 transmits the data stored in the RAM 13 to the host 2 via the host I/F 15.

(Receiver Circuit)

Figure 3:
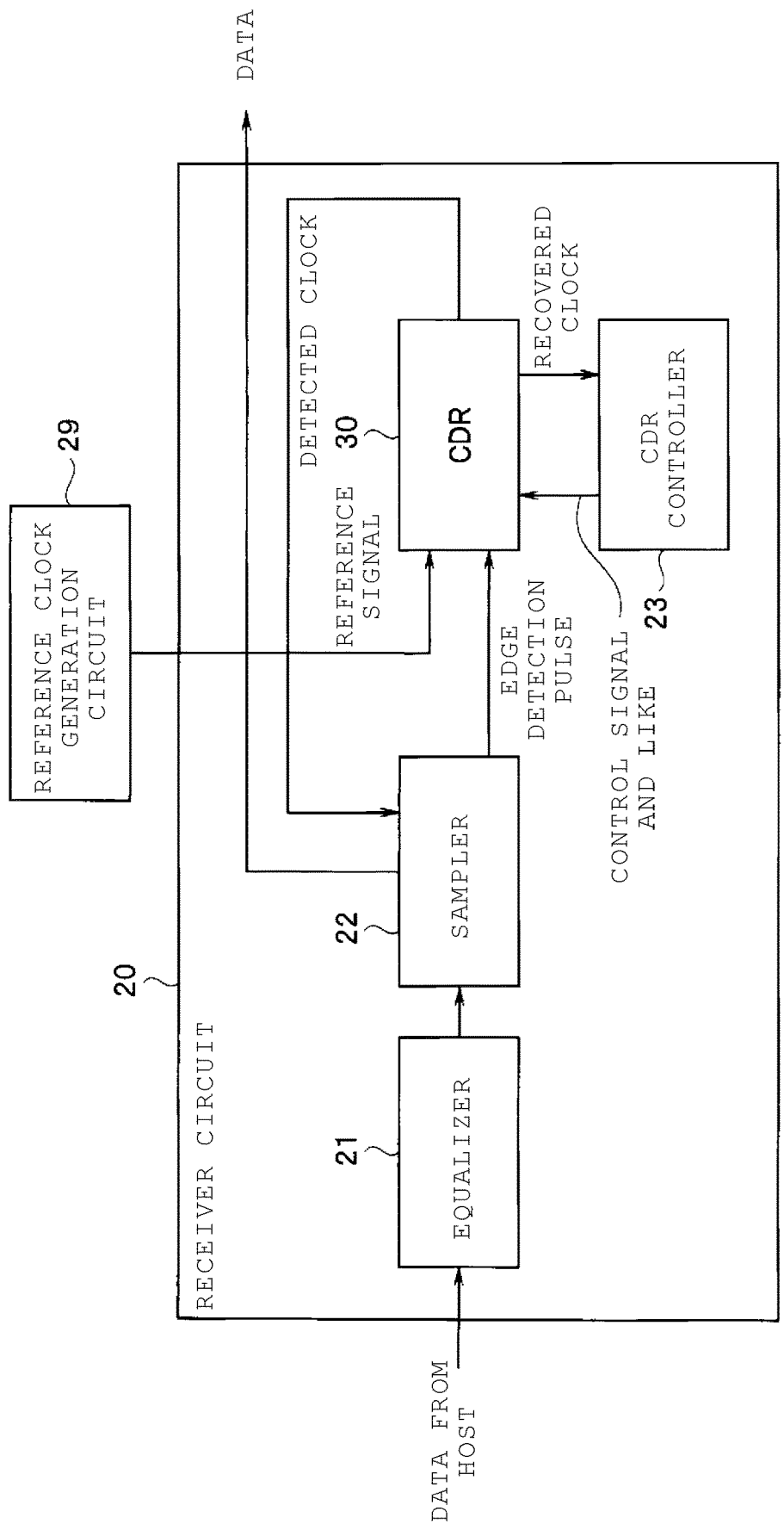
FIG. 3 is a block diagram illustrating one example of a specific configuration of a receiver circuit in FIG. 2.

FIG. 3 is a block diagram illustrating one example of a specific configuration of the receiver circuit 20 in FIG. 2.

The receiver circuit 20 receives transmitted data from the host 2. An equalizer 21 shapes the waveform of the received data and outputs the data to a sampler 22. The sampler 22 extracts data from the data received from the equalizer 21 and outputs the extracted data to a subsequent-stage circuit (not illustrated). The sampler 22 receives a detected clock described below from the CDR 30 and extracts data using the detected clock. Based on the detected clock from the CDR 30, the sampler 22 generates an edge detection pulse for detecting an edge of received data and outputs the generated edge detection pulse to the CDR 30.

The CDR 30 recovers a clock of the received data based on the edge detection pulse, outputs the detected clock to the sampler 22, and outputs the recovered clock to a CDR controller 23. Based on the recovered clock, the CDR controller 23 generates various control signals or the like for controlling the CDR 30 and outputs the generated control signals or the like to the CDR 30. Further, a reference signal is also applied from a reference clock generation circuit 29 to the CDR 30. The reference signal is a clock at a given frequency and is also used in the transmitter circuit 18. Therefore, the reference clock generation circuit 29 may be provided in the transmitter circuit 18.

(PLL Circuit)

Figure 4:
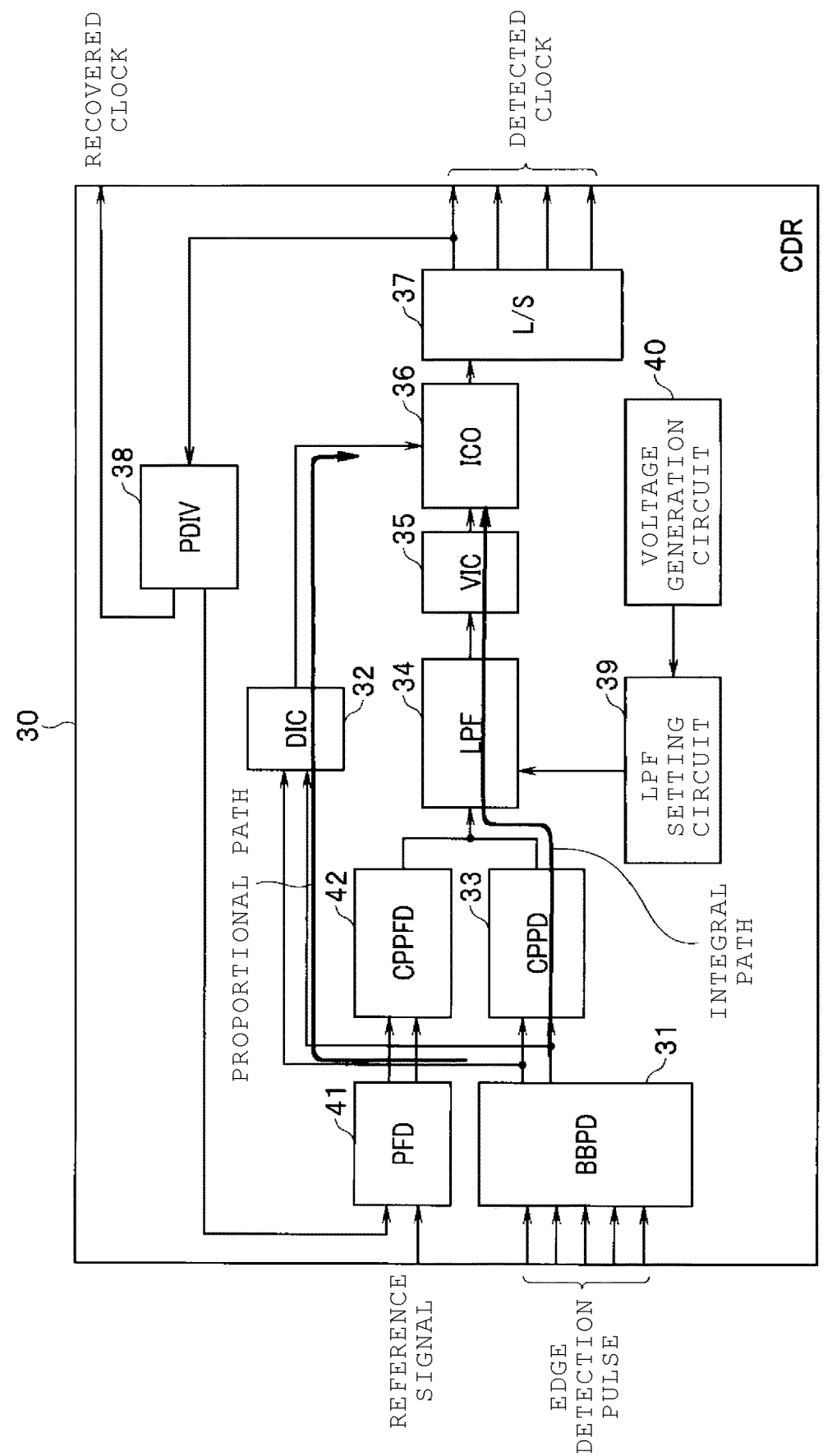
FIG. 4 is a block diagram illustrating one example of a PLL circuit configured in a CDR in FIG. 3.

FIG. 4 is a block diagram illustrating one example of mainly the PLL circuit portion among the components of the CDR 30 in FIG. 3. That is, the CDR 30 includes the PLL circuit.

The PLL circuit in the CDR 30 recovers the clock using a phase frequency detector (hereinafter, referred to as "PFD") 41 until the frequency is temporarily locked from immediately after start-up. Once the frequency is temporarily locked, the PLL circuit recovers the clock using a bang-bang PD (hereinafter, referred to as "BBPD") 31 that is a phase detector. The BBPD 31 cannot detect a difference in frequency as described below. Therefore, in order to reduce the time required until the frequency is locked immediately after start-up, the PFD 41 can detect a difference in frequency and a difference in phase.

Immediately after start-up, the PFD 41 operates as follows. A reference signal is applied from the reference clock generation circuit 29 to the PFD 41, and the PFD 41 detects a difference in frequency and a difference in phase between the reference signal and an output clock of the divider (hereinafter, referred to as "PDIV") 38 described below, and outputs the detection results to a charge pump PFD (hereinafter, referred to as "CPPFD") 42. The CPPFD 42 generates a voltage in accordance with the detection results of the difference in frequency and the difference in phase between the reference signal and the output clock of the PDIV 38. The output from the CPPFD 42 is supplied to a voltage-current converter circuit (hereinafter, referred to as "VIC") 35 after passing through a low pass filter (LPF) 34 having given frequency characteristics.

The VIC 35 converts the supplied voltage into a current and outputs the current to a current control oscillator (hereinafter, referred to as "ICO") 36. The ICO 36 can be configured with, for example, a ring oscillator. The ICO 36 oscillates at a frequency corresponding to the input current and outputs the oscillation clock to a level shifter (hereinafter, referred to as "L/S") 37. The L/S 37 adjusts a level of the oscillation clock from the ICO 36 and supplies the oscillation clock having the adjusted level to the PDIV 38. The PDIV 38 outputs a clock divided from the oscillation clock from the L/S 37. The output clock from the PDIV 38 is fed back to the PFD 41, and is also output to the CDR controller 23 as the recovered clock.

When the frequency of the recovered clock is higher than the frequency of the reference signal or when the phase of the recovered clock is earlier than the phase of the reference signal, the detection result of the PFD 41 is "Early" representing that the frequency is high or the phase is early. The CPPFD 42 outputs a minus (negative) current for decreasing the frequency of the recovered clock. In addition, when the frequency of the recovered clock is lower than the frequency of the reference signal or when the phase of the recovered clock is later than the phase of the reference signal, the detection result of the PFD 41 is "Late" representing that the frequency is low or the phase is late. The CPPFD 42 outputs a plus (positive) current for increasing the frequency of the recovered clock. As a result, the frequency of the oscillation clock of the ICO 36 converges to the frequency of the reference signal due to the loop of the PFD 41, the CPPFD 42, the LPF 34, the VIC 35, the ICO 36, the L/S 37, and the PDIV 38.

After locking the frequency, the BBPD 31 operates instead of the PFD 41. The L/S 37 outputs the oscillation clock of the ICO 36 to the PDIV 38 as it is, and outputs a plurality of clocks obtained by shifting the oscillation clock of the ICO 36 by phases (for example, on a certain period (for example, 90°) basis) to the sampler 22 as the detected clock. The sampler 22 generates an edge detection pulse based on the detected clock and applies the edge detection pulse to the BBPD 31 of the CDR 30. The BBPD 31 detects a direction of the edge of the received data using the edge detection pulse. That is, the BBPD 31 determines the direction of the edge of the received data in the plurality of phases obtained by shifting the oscillation clock of the ICO 36 by periods such that a phase detection result representing whether the phase of the oscillation clock is earlier or later than the phase of the received data is obtained. When the phase of the received data is earlier than the phase of the oscillation clock, the BBPD 31 outputs the phase detection result "Early". When the phase of the received data is later than the phase of the oscillation clock, the BBPD 31 outputs the phase detection result "Late".

The output of the BBPD 31 is used for controlling the oscillation output of the ICO 36 via two paths including a proportional path and an integral path. The proportional path is configured with the BBPD 31, a digital-to-current converter (hereinafter, referred to as "DIC") 32, and the ICO 36. The DIC 32 switches stepwisely the amount of current to be supplied to the ICO 36 based on "Early" and "Late" output from the BBPD 31. The DIC 32 can rapidly switch the amount of current to be supplied to the ICO 36. That is, the proportional path is suitable for controlling a frequency in a high frequency range.

When the oscillation clock of the ICO 36 is controlled based on the output of the BBPD 31, a resistor included in the LPF 34 is short-circuited. Due to the short-circuiting of the resistor, charges are accumulated on a capacitor included in the LPF 34 in accordance with charge and discharge currents, and a terminal voltage of the capacitor corresponds to an integrated value of the charge and discharge currents. That is, the integral path is configured with the BBPD 31, a BBPD charge pump (hereinafter, referred to as "CPPD") 33, the capacitor that integrates the output of the CPPD 33, the VIC 35, and the ICO 36. The CPPD 33 outputs the minus current and the plus current based on "Early" and "Late" output from the BBPD 31, respectively. This current becomes an integrated voltage in the LPF 34, the voltage is converted into a current in the VIC 35, and the current is supplied to the ICO 36. That is, the integral path controls the ICO 36 based on a result obtained by accumulating previous differences in phase by time integration and operates such that the difference in phase becomes 0. Accordingly, the integral path is suitable for controlling a frequency in a low frequency range. This way, by combining the proportional path and the integral path, the PLL circuit executes the accurate frequency control while enabling the high speed operation such that the detected clock and the recovered clock corresponding to the received data can be obtained.

In addition, in the CDR 30, a LPF setting circuit 39 and a voltage generation circuit 40 are provided. The LPF setting circuit 39 applies a voltage from the voltage generation circuit 40 to the LPF 34 such that an input voltage of the VIC 35 is set to a certain voltage.

(Problem and Method for Solving Problem)

Figure 5:
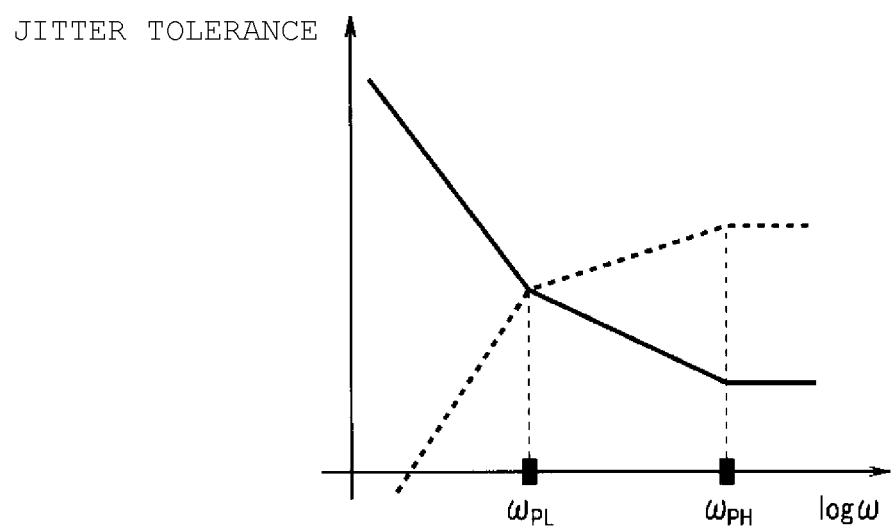
FIG. 5 is a graph illustrating frequency characteristics of the CDR based on characteristics of the PLL circuit, where the horizontal axis represents a frequency and the vertical axis represents jitter tolerance.

FIG. 5 is a graph illustrating frequency characteristics of the CDR based on characteristics of the PLL circuit, where the horizontal axis represents a frequency and the vertical axis represents a jitter tolerance. In FIG. 5, a broken line represents characteristics of jitter track in a graph in which the amplitude of jitter is a function of time, and a solid line represents characteristics of a jitter tolerance.

As indicated by the solid line in FIG. 5, it can be seen that sufficiently high jitter tolerance can be obtained in a relatively low frequency range. When the frequency is relatively high, the jitter tolerance decreases. When a frequency that can be tracked by the CDR (PLL circuit) with respect to the input frequency is represented by ω, in general, the PLL circuit is designed such that a frequency range of ω−3 dB can be tracked.

A designed value ωPH of the PLL circuit can be represented by the following Expression (1).

$$\omega PH \approx \omega{-3} \text{ } DB \times KBBPD \times KICO \times Idic \quad (1)$$

Further, KBBPD, KICO, and Idic represent a gain of the BBPD 31, a gain of the ICO 36 (Δfrequency/Δcurrent), and a current generated by the DIC 32 on the proportional path of the PLL circuit, respectively.

The characteristics of the proportional path of the PLL circuit fluctuate depending on various influences, the high frequency characteristics and trackability of the PLL circuit fluctuate depending on a fluctuation in the value of ωPH, and there is a problem in that jitter tolerance characteristics expected in the CDR cannot be obtained.

Therefore, in the embodiment, calibration for correcting the fluctuation of the proportional path of the PLL circuit can be executed. Further, the gain KBBPD of the BBPD 31 is extremely difficult to adjust. Therefore, in the embodiment, calibration is executed such that measured KICO×Idic is a desired or particular (e.g., ideal) value. In particular, in the embodiment, by controlling the current of the DIC 32 (controlling Idic) that is easily adjustable, the calibration of the PLL circuit is executed.

(Specific Circuit)

Figure 6:
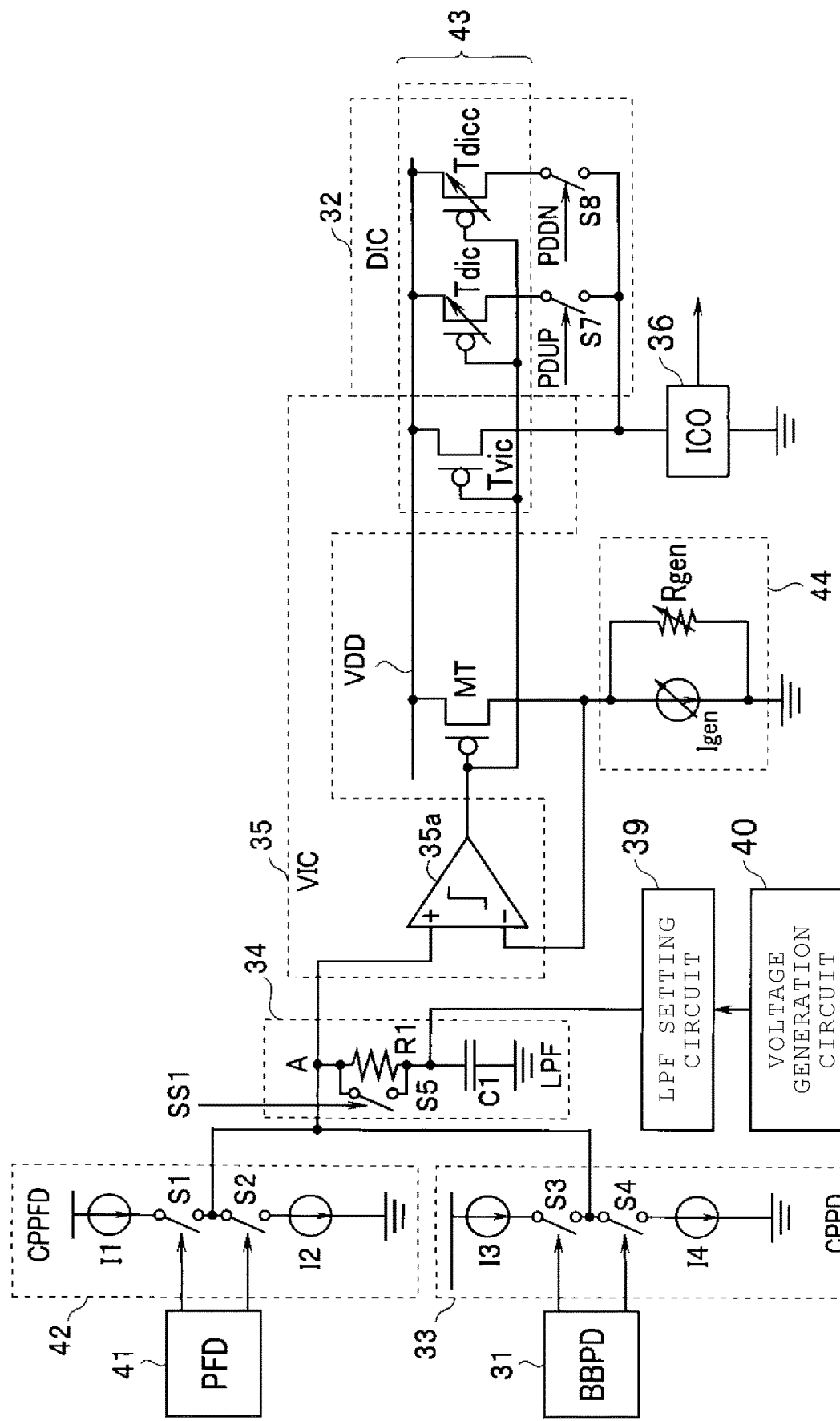
FIG. 6 is a circuit diagram illustrating one example of a specific configuration of the PLL circuit illustrated in FIG. 4.

FIG. 6 is a circuit diagram illustrating one example of a specific configuration of the PLL circuit illustrated in FIG. 4.

The CPPFD 42 includes: a current source I1 that is connected to a line as a power supply potential; a switch S1 for outputting a current from the current source I1 to an external circuit; a current source I2 that is connected to a ground line applying a reference potential; and a switch S2 for drawing a current from an external circuit to the current source I2. The PFD 41 is configured to control the two switches S1 and S2 in the CPPFD 42. Further, the PFD 41 turns on the switch S1 based on "Late". In addition, the PFD 41 turns on the switch S2 based on "Early".

In addition, the CPPD 33 has the same configuration as the CPPFD 42. The CPPD 33 includes: a current source I3 that is connected to a line as a power supply potential; a switch S3 for outputting a current from the current source I3 to an external circuit; a current source I4 that is connected to a ground line applying a reference potential; and a switch S4 for drawing a current from an external circuit to the current source I4. The BBPD 31 is configured to control the two switches S3 and S4 in the CPPD 33. Further, the BBPD 31 turns on the switch S3 and turns off the switch S4 based on "Late". The BBPD 31 turns on the switch S4 and turns off the switch S3 based on "Early".

The LPF 34 includes a resistor R1 and a capacitor C1. The resistor R1 and the capacitor C1 are connected in series between an output terminal of the CPPFD 42 and an output terminal of the CPPD 33 (hereinafter, referred to as "node A") and the ground line. A switch S5 is provided in parallel with the resistor R1, and when the switch S5 is turned on, the node A is connected directly to the capacitor C1. The switch S5 is controlled based on a switching signal SS1 output from the CDR controller 23. When the oscillation clock is controlled using the output of the PFD 41, the switch S5 is turned off, and when the oscillation clock is controlled using the output of the BBPD 31, the switch S5 is turned on.

The VIC 35 includes: an operational amplifier 35*a*; and a current source (a transistor Tvic) that generates a current based on an output of the operational amplifier 35*a*. A voltage of the node A is applied to a positive input terminal of the operational amplifier 35*a*. In addition, the LPF setting circuit 39 is connected to the positive input terminal of the operational amplifier 35*a* through the resistor R1. The LPF setting circuit 39 is configured such that the voltage of the positive input terminal of the operational amplifier 35*a* can be set to a given voltage using the voltage generated by the voltage generation circuit 40. The voltage generation circuit 40 generates a certain voltage and supplies the generated voltage to the LPF setting circuit 39.

An output terminal of the operational amplifier 35*a* is connected to a gate of a PMOS transistor MT in a mirror circuit 43. A source of the transistor MT is connected to a power supply line VDD, a drain of the transistor MT is connected to an adjustment circuit 44 and is also connected to a negative input terminal of the operational amplifier 35*a*. The adjustment circuit 44 includes: a current source Igen that is connected between the drain of the transistor MT and the ground line; and a variable resistor Rgen that is connected in parallel with the current source Igen. The operational amplifier 35*a* drives the transistor MT based on a difference between the voltage supplied to the positive input terminal and a voltage drop generated by the resistor Rgen and supplied to the negative input terminal. As a result, the transistor MT generates a drain current that changes depending on the voltage applied to the positive input terminal of the operational amplifier 35*a*.

A PMOS transistor Tvic, a PMOS transistor Tdic, and a PMOS transistor Tdicc are provided in the mirror circuit 43 together with the transistor MT. In the transistors Tvic, Tdic, and Tdicc, sources are connected to the power supply line VDD, and gates are connected in common to the gate of the transistor MT.

A drain of the transistor Tvic is connected to the ICO 36. Due to the transistor Tvic, a current corresponding to the output of the operational amplifier 35*a* is supplied to the ICO 36.

A drain of the transistor Tdic is connected to the ICO 36 via a switch S7. A drain of the transistor Tdicc is connected to the ICO 36 via a switch S8. The transistors Tdic and Tdicc and the switches S7 and S8 configure the DIC 32. The switch S7 is controlled to be turned on and off based on a signal PDUP corresponding to "Late" output from the BBPD 31, and the switch S8 is controlled to be turned on and off based on a signal PDDN corresponding to "Early" output from the BBPD 31.

In the embodiment, the CDR controller 23 can change characteristics of the DIC 32. For example, by preparing a plurality of transistors having different sizes as the transistors Tdic and Tdicc such that the transistor that is operated by the CDR controller 23 can be selected, even when the output voltage of the operational amplifier 35*a* does not change, the amount of current (Idic) that is supplied from the DIC 32 to the ICO 36 can be changed.

(PLL Operation)

Until the frequency is locked from immediately after start-up, the switch S5 is turned off, and the PFD 41 operates. The PFD 41 controls the switches S1 and S2 based on a difference in frequency and a difference in phase between the reference signal and the output clock of the PDIV 38. That is, when the frequency of the output clock is lower than the frequency of the reference signal or when the phase of the output clock is later than the phase of the reference signal, the PFD 41 acquires the detection result of "Late" and turns on the switch S1 such that the plus current is supplied from the current source I1 to the LPF 34. In addition, when the frequency of the output clock is lower than the frequency of the reference signal or when the phase of the output clock is earlier than the phase of the reference signal, the PFD 41 acquires the detection result of "Early" and turns on the switch S2 such that the minus current is supplied from the current source I2 to the LPF 34.

That is, when the frequency of the oscillation clock is lower than the frequency of the reference signal or when the phase of the oscillation clock is later than the phase of the reference signal, the voltage increases due to the resistor R1, and the voltage that is supplied to the positive input terminal of the operational amplifier 35a is higher than the voltage that is set by the LPF setting circuit 39. Conversely, when the frequency of the oscillation clock is higher than the frequency of the reference signal or when the phase of the oscillation clock is earlier than the phase of the reference signal, the voltage decreases due to the resistor R1, and the voltage that is supplied to the positive input terminal of the operational amplifier 35a is lower than the voltage that is set by the LPF setting circuit 39.

The output voltage of the operational amplifier 35a changes depending on the voltage that is applied to the positive input terminal. The drain current of the transistor MT increases or decreases depending on the output voltage of the operational amplifier 35a. The drain current of the transistor Tvic configuring the mirror circuit 43 together with the transistor MT also changes in the same manner as that of the drain current of the transistor MT. The drain current of the transistor Tvic is supplied to the ICO 36. The ICO 36 generates an oscillation clock having a frequency corresponding to the drain current. The oscillation clock of the ICO 36 is fed back to the PFD 41 via the L/S 37 and the PDIV 38 such that the frequency of the oscillation clock of the ICO 36 converges to the frequency of the reference signal.

(Integral Path)

After locking the frequency, the switch S5 is turned on and the BBPD 31 operates. The BBPD 31 controls the switches S3 and S4 based on the edge detection pulse based on the detected clock output from the L/S 37. That is, when the phase of the output clock is later than the phase of the received data, the BBPD 31 generates "Late" as the phase detection result. In this case, the BBPD 31 turns on the switch S3 such that the current from the current source I3 is supplied to the capacitor C1 via the switch S5. In addition, when the phase of the output clock is earlier than the phase of the received data, the BBPD 31 generates "Early" as the phase detection result. In this case, the BBPD 31 turns on the switch S4 such that charges of the capacitor C1 are drawn by the current source I4.

That is, when the phase of the oscillation clock is later than the phase of the received data, the terminal voltage of the capacitor C1 increases such that the voltage that is supplied to the positive input terminal of the operational amplifier 35a increases. Conversely, when the phase of the oscillation clock is earlier than the phase of the received data, the terminal voltage of the capacitor C1 decreases such that the voltage that is supplied to the positive input terminal of the operational amplifier 35a decreases.

As described above, the output voltage of the operational amplifier 35a changes depending on the voltage that is applied to the positive input terminal, and the drain current of the transistor MT increases or decreases depending on this change. The drain current of the transistor Tvic also increases or decreases depending on the increase or decrease in the drain current of the transistor MT, and the current that is supplied to the ICO 36 also increases or decreases. As a result, the frequency of the oscillation clock of the ICO 36 changes such that the frequency of the oscillation clock of the ICO 36 matches the frequency of the clock of the received data.

(Proportional Path)

In the integral path, the frequency of the oscillation clock of the ICO 36 is controlled in accordance with the time integration of the amount of current based on "Early" and the amount of current based on "Late" by the CPPD 33. Therefore, the tracking speed of the frequency control is relatively slow. Therefore, the proportional path capable of controlling a frequency in a high frequency range is adopted.

The phase detection result of "Early" is output from the BBPD 31 to the switch S8, and the phase detection result of "Late" is output from the BBPD 31 to the switch S7. The switch S7 is turned off until "Late" is generated, and is turned on when "Late" is generated. In addition, the switch S8 is turned on until "Early" is generated, and is turned off when "Early" is generated. Accordingly, until "Early" or "Late" is generated, only the switch S8 is turned on such that a drain current Idicc of the transistor Tdicc is supplied to the ICO 36. When "Early" is generated, the switches S7 and S8 are turned off such that the current is not supplied from the DIC 32 to the ICO 36. When "Late" is generated, the switches S7 and S8 are turned on such that a drain current Idic of the transistor Tdic and the drain current Idicc of the transistor Tdicc are supplied to the ICO 36. Further, the current value Idic of the drain current Idic and the current value Idicc of the drain current Idicc are set to be the same value (Idic=Idicc) such that the amounts of phase shift by the signal "Early" or "Late" are the same.

As a result, when "Late" is generated, the frequency of the oscillation clock of the ICO 36 increases. When "Early" is generated, the frequency of the oscillation clock of the ICO 36 decreases. The switches S7 and S8 operate instantaneously depending on the generation of "Early" or "Late". Therefore, the frequency of the oscillation clock of the ICO 36 is controlled with extremely high speed. That is, the tracking speed of the frequency control in the proportional path is extremely fast.

In the embodiment, the CDR controller 23 is configured such that the control of the amount of current of the current source Igen in the CDR 30, the control of the resistance value of the resistor Rgen, the control of the current Idic by the transistors Tdic and Tdicc, the control of the LPF setting circuit 39, and the ON and OFF control of the switch S5 can be executed.

(Calibration)

Figure 7:
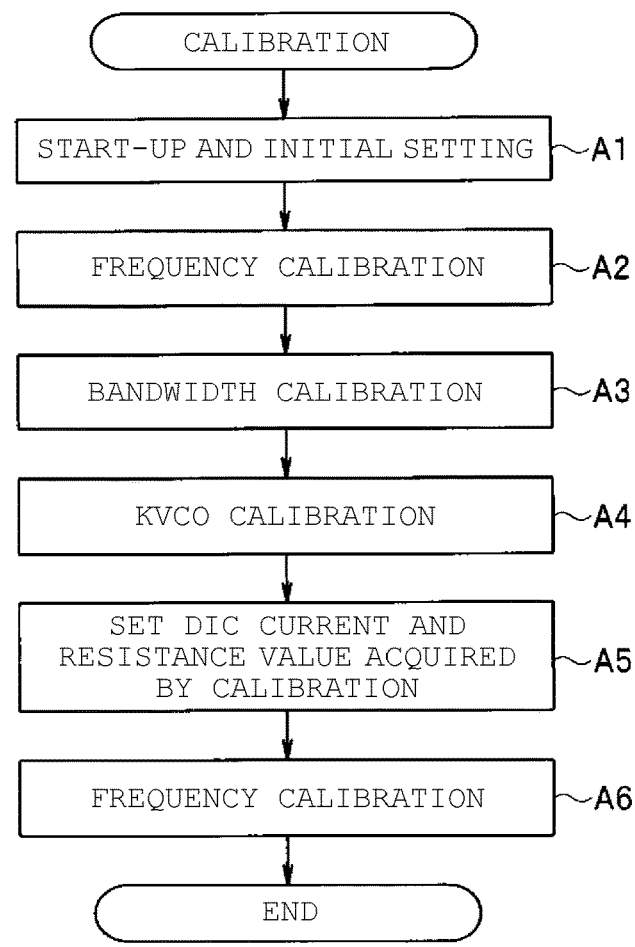
FIG. 7 is a flowchart illustrating calibration in the embodiment.
Figure 8:
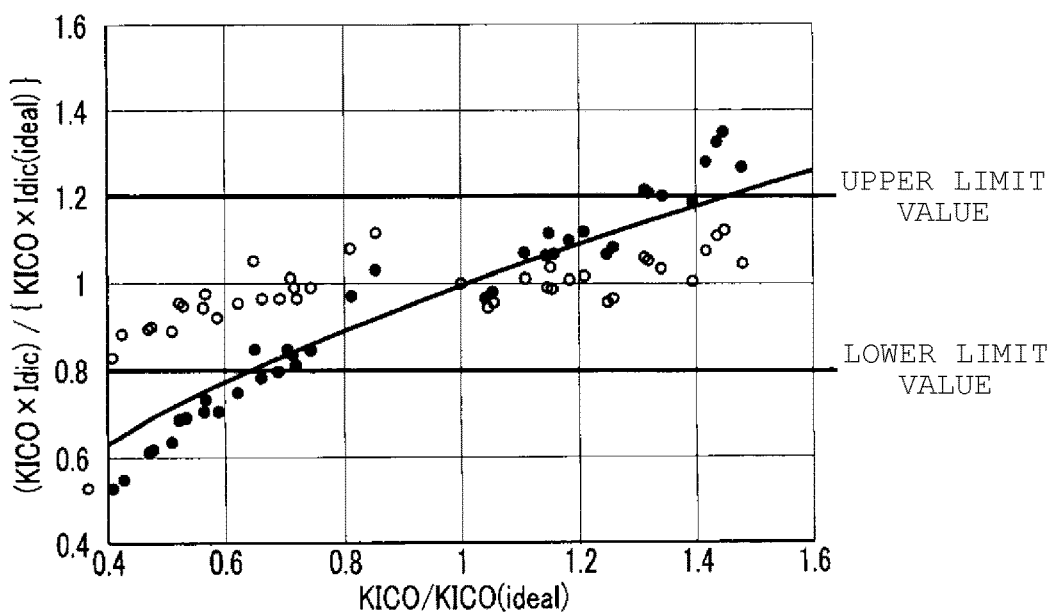
FIG. 8 is a graph illustrating adjustment of Idic.

Next, a calibration control in the embodiment will be described with reference to FIGS. 7 and 8. FIG. 7 is a flowchart illustrating the calibration in the embodiment. FIG. 8 is a graph illustrating the adjustment of the Idic.

The gain of the ICO 36 (Δfrequency/Δcurrent) fluctuates depending on various influences such as a fluctuation in element or a change in temperature environment. Therefore, in the embodiment, in order to adjust ωPH in Expression (1) to the ideal value, the current value that is supplied by the DIC 32 is adjusted. Further, the calibration process of FIG. 7 for adjusting the current value that is supplied by the DIC 32 may be executed once immediately after the power-on of the receiver circuit 20, or may be executed at a given timing after start-up, for example, periodically.

As illustrated in FIG. 7, in A1, when the receiver circuit 20 is powered on, the CDR controller 23 executes initial setting of the respective units. Next, in A2, the CDR controller 23 executes the frequency calibration. In the frequency calibration, the CDR controller 23 controls the LPF setting circuit 39 first such that a voltage that is ½ of the voltage VDD supplied to the power supply line VDD is applied to the positive input terminal of the operational amplifier 35a. As a result, the variable range of the output of the operational amplifier 35a is maximized. The transistor MT is driven in accordance with the output of the operational amplifier 35a such that the drain currents of the transistors Tvic and Tdicc configuring the mirror circuit 43 flow.

These drain currents are supplied to the ICO 36, and the ICO 36 generates the oscillation clock of the frequency corresponding to the supplied current by current frequency conversion. This oscillation clock is supplied to the PDIV 38 via the L/S 37. The PDIV 38 divides the oscillation clock output from the L/S 37 and outputs the divided clock to the CDR controller 23 as the recovered clock. A reference clock of a reference frequency is input to the CDR controller 23 (not illustrated), and the CDR controller 23 can acquire the frequency of the recovered clock using this reference clock.

The CDR controller 23 controls the current source Igen such that the amount of current of the current source Igen is adjusted. When the amount of current of the current source Igen changes, the voltage drop amount of the resistor Rgen changes. The output voltage of the operational amplifier 35a corresponds to the voltage drop amount of the resistor Rgen. That is, by adjusting the amount of current of the current source Igen, the drain currents of the transistors Tvic, Tdic, and Tdicc can be adjusted, and the frequency of the oscillation clock of the ICO 36 can be adjusted. By controlling the current source Igen while monitoring the frequency of the recovered clock, the CDR controller 23 adjusts the frequency of the oscillation clock of the ICO 36 to a target frequency.

Next, the CDR controller 23 executes bandwidth calibration (A3). This bandwidth calibration improves the high frequency characteristics of the PLL circuit of the CDR 30, and refers to calibration for adjusting ωPH in Expression (1) to the ideal value.

First, in order to maximize the range where calibration can be executed, the CDR controller 23 controls the LPF setting circuit 39 such that the voltage of VDD/2 is applied to the positive input terminal of the operational amplifier 35a. In this state, the CDR controller 23 controls the current source Igen such that the amount of current changes. For example, the CDR controller 23 changes the amount of current of the current source Igen by Δ100 μA. As a result, the frequency of the oscillation clock of the ICO 36 also changes. Further, the example where the amount of current of the current source Igen changes by only Δ100 μA will be described. It is noted that the amount of change in the amount of current is not limited thereto. The amount of change in the amount of current of the current source Igen may be set to a value in a range where the frequency of the oscillation clock comparatively linearly changes relative to the change in the amount of current and the change in the frequency of the oscillation clock is not in a range of error.

By controlling the current source Igen while monitoring the frequency of the recovered clock, in the CDR controller 23, KICO=ΔFrequency/ΔCurrent representing the ratio of the frequency that changes per unit current in the current frequency conversion of the ICO 36 is acquired.

Further, during the calibration, the BBPD 31 does not output any phase detection results of the "Early" and "Late". Accordingly, in this case, only the switch S8 is turned on such that the current supplied from the DIC 32 to the ICO 36 is the current Idicc. Further, Idicc=Idic. Therefore, in the following description, the current that is supplied from the DIC 32 in the calibration is Idic.

In the embodiment, when the measured KICO deviates from a preset ideal value KICO (ideal), the CDR controller 23 changes the current Idic of the DIC 32 such that KICO× Idic is the ideal value. That is, when the preset ideal value as Idic is represented by Idic (ideal), the CDR controller 23 increases or decreases the drain currents by the transistors Tdic and Tdicc such that KICO×Idic matches the value of KICO (ideal)×Idic (ideal). That is, the CDR controller 23 adjusts the current that is generated by the DIC 32 based on KICO that is frequency/current characteristics of the ICO 36.

In FIG. 8, the horizontal axis represents {KICO/KICO (ideal)}, the vertical axis represents (KICO×Idic)/{KICO× Idic (ideal)}, and when the amount of current of the current source Igen is changed, a relationship between the ratios is illustrated by black circles.

{KICO/KICO (ideal)} represents the ratio of the measured KICO to the ideal value KICO (ideal). In addition, KICO×Idic corresponds to the amount of change in the phase of the oscillation clock of the ICO 36 by the actual drain current Idic in the DIC 32. In addition, KICO×Idic (ideal) corresponds to the amount of change in the phase of the oscillation clock of the ICO 36 by the ideal drain current value Idic (ideal) in the DIC 32.

When a characteristic curve approximated to the results of the black circles in FIG. 8 is acquired, the following Expression (2) is obtained. The curve in FIG. 8 represents the characteristic curve of Expression (2).

$$(KICO \times Idic)/\{KICO \times Idic\ (ideal)\} = \{KICO/KICO\ (ideal)\}^{1/2} \quad (2)$$

That is, when KICO changes from the ideal value KICO (ideal) due to the change in the current of the current source Igen, the curve of FIG. 8 represents the degree to which the amount of phase change by Idic changes with respect to the amount of phase change by the ideal value Idic (ideal). As illustrated in FIG. 8, as {KICO/KICO (ideal)} decreases, (KICO×Idic)/{KICO×Idic (ideal)} (=Idic/Idic (ideal)) also decreases, and as {KICO/KICO (ideal)} increases, (KICO× Idic)/{KICO×Idic (ideal)} (=Idic/Idic (ideal)) also increases.

By modifying Expression (2), the following Expression (3) is obtained.

$$Idic/Idic\ (ideal) = \{KICO/KICO\ (ideal)\}^{1/2} \quad (3)$$

In order to match KICO×Idic to KICO (ideal)×Idic (ideal), Idic/Idic (ideal) may be multiplied by the inverse of the right side in Expression (3). That is, the correction value of Idic/Idic (ideal) may be acquired from Expression (4).

$$Idic/Idic\ (ideal) = 1/\{KICO/KICO\ (ideal)\}^{1/2} \quad (4)$$

The CDR controller 23 changes the drain current of the DIC 32 by $1/\{KICO/KICO\ (ideal)\}^{1/2}$ using {KICO/KICO (ideal)} acquired by changing the amount of current of the current source Igen by Δ100 μA.

Further, each of white circles of FIG. 8 represents a value when the value of each of the black circles is corrected using Expression (4). As indicated by the white circles, these values are values in a range between an allowable upper limit value and an allowable lower limit value. Further, the allowable upper limit value and the allowable lower limit value in FIG. 8 represent values defined as targets in the band of the CDR.

As illustrated in FIG. 7, after the bandwidth calibration of A3, the CDR controller 23 executes KVCO calibration (A4). In the KVCO calibration, first, the CDR controller 23 controls the LPF setting circuit 39 and the voltage of VDD/2 is applied to the positive input terminal of the operational amplifier 35a. In this state, the CDR controller 23 monitors the frequency of the oscillation clock of the ICO 36 and changes the amount of current of the current source Igen until the frequency of the oscillation clock reaches the target frequency. Once the frequency of the oscillation clock of the ICO 36 reaches the target frequency, the CDR controller 23 controls the LPF setting circuit 39 such that the voltage that is applied to the positive input terminal of the operational amplifier 35*a* changes by ΔV. As a result, the frequency of the oscillation clock of the ICO 36 also changes. The CDR controller 23 acquires ΔF that is the amount of change in the frequency of the oscillation clock, and acquires ΔF/ΔV=KVCO. Next, the CDR controller 23 changes the resistance value of the resistor Rgen such that the acquired KVCO is an ideal value KVCO (ideal).

Further, when the resistance value of the resistor Rgen is Rgen, KVCO is proportional to 1/Rgen. Therefore, the CDR controller 23 may determine the amount of correction with respect to an initial resistance value Rgen (def) of the resistor Rgen according to the following Expression (5).

$$Rgen=KVCO/KVCO\ (ideal)\times(Rgen\ (def)) \qquad (5)$$

This way, when the KVCO calibration ends, the CDR controller 23 sets the ideal drain current of the DIC 32 and the ideal resistance value of the resistor Rgen acquired in A3 and A4 to the PLL circuit (A5). As a result, the frequency of the oscillation clock of the ICO 36 deviates from the target frequency. Therefore, through the same frequency calibration as that of A2, the CDR controller 23 changes the amount of current of the current source Igen such that the frequency of the ICO 36 matches the target frequency (A6).

This way, in the embodiment, the bandwidth calibration for improving the high frequency characteristics of the proportional path of the PLL circuit is executed such that ωPH that determines the high frequency characteristics of the PLL circuit becomes the ideal value. Therefore, the jitter tolerance of the CDR can be improved irrespective of the characteristic fluctuation of the PLL circuit.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A receiving device comprising:
    a clock data recovery circuit including a phase-locked loop (PLL) circuit having a current control oscillator, a phase detector, an integral path, and a proportional path, and configured to receive a signal and recover a clock and data from the received signal based on an output of the PLL circuit, wherein
        the current control oscillator is configured to generate an oscillation clock based on a first current and a second current,
        the phase detector is configured to acquire a phase detection result based on the oscillation clock and the received signal,
        the integral path is configured to generate the first current based on an integrated value of the phase detection results and supply the first current to the current control oscillator, and
        the proportional path includes a digital-to-current converter configured to generate the second current based on the phase detection result and supply the second current to the current control oscillator; and
        a controller configured to adjust the second current based on frequency-current characteristics of the current control oscillator.

2. The receiving device according to claim 1, wherein the controller is configured to adjust the second current such that a product of the frequency-current characteristics and the second current matches a product of a particular value of the frequency-current characteristics and a particular value of the second current.

3. A memory controller comprising:
    an interface circuit including the receiving device according to claim 2; and
    a control circuit configured to control reading and writing from and into one or more memory chips based on a signal received from a host by the receiving device.

4. The receiving device according to claim 1, wherein the controller is configured to adjust the second current based on a ratio between a value of the frequency-current characteristics and a particular value of the frequency-current characteristics.

5. A memory controller comprising:
    an interface circuit including the receiving device according to claim 4; and
    a control circuit configured to control reading and writing from and into one or more memory chips based on a signal received from a host by the receiving device.

6. The receiving device according to claim 1, wherein the integral path includes a voltage-current converter circuit including a generation circuit and a first current source, the generation circuit being configured to generate a voltage based on the integrated value of the phase detection results, and the first current source being configured to generate a current based on an output of the generation circuit.

7. The receiving device according to claim 6, wherein the digital-to-current converter includes a second current source configured to generate the second current,
    the first current source and the second current source are configured as a common mirror circuit, and
    the controller is configured to acquire a value of the frequency-current characteristics by detecting a frequency of the oscillation clock while controlling a set value of the generation circuit.

8. A memory controller comprising:
    an interface circuit including the receiving device according to claim 7; and
    a control circuit configured to control reading and writing from and into one or more memory chips based on a signal received from a host by the receiving device.

9. A memory controller comprising:
    an interface circuit including the receiving device according to claim 6; and
    a control circuit configured to control reading and writing from and into one or more memory chips based on a signal received from a host by the receiving device.

10. The receiving device according to claim 1, wherein the frequency-current characteristics are each a gain of the current control oscillator to a frequency.

11. A memory controller comprising:
    an interface circuit including the receiving device according to claim 10; and
    a control circuit configured to control reading and writing from and into one or more memory chips based on a signal received from a host by the receiving device.

12. The receiving device according to claim 1, wherein the integral path is configured to control a frequency in a first frequency range, and the proportional path is configured to control a frequency in a second, higher frequency range.

13. A memory controller comprising:
an interface circuit including the receiving device according to claim 12; and
a control circuit configured to control reading and writing from and into one or more memory chips based on a signal received from a host by the receiving device.

14. A memory controller comprising:
an interface circuit including the receiving device according to claim 1; and
a control circuit configured to control reading and writing from and into one or more memory chips based on a signal received from a host by the receiving device.

15. A control method of a receiving device that includes a clock data recovery circuit, the clock data recovery circuit including a phase-locked loop (PLL) circuit that has a current control oscillator, a phase detector, an integral path, and a proportional path,
the current control oscillator being configured to generate an oscillation clock in accordance with a first current and a second current,
the phase detector being configured to acquire a phase detection result based on the oscillation clock and a received signal,
the integral path including a voltage-current converter circuit configured to convert, based on an integrated value of the phase detection results, a voltage into the first current and to supply the first current to the current control oscillator, and
the proportional path including a digital-to-current converter configured to generate the second current based on the phase detection result and to supply the second current to the current control oscillator, and
the control method comprising:
changing the first current to adjust a frequency of the oscillation clock output from the current control oscillator to a target frequency;
adjusting the second current in accordance with frequency-current characteristics of the current control oscillator;
changing a voltage applied to the voltage-current converter circuit to adjust the frequency-voltage characteristics of the current control oscillator; and
changing the first current to adjust a frequency of an oscillation clock to the target frequency in response to adjusting the second current and the frequency-voltage characteristics.

16. The control method according to claim 15, further comprising:
adjusting the second current such that a product of the frequency-current characteristics and the second current matches a product of a particular value of the frequency-current characteristics and a particular value of the second current.

17. The control method according to claim 15, further comprising:
adjusting the second current based on a ratio between a value of the frequency-current characteristics and a particular value of the frequency-current characteristics.

18. The control method according to claim 15, wherein the integral path includes the voltage-current converter circuit including a generation circuit and a first current source, the generation circuit being configured to generate a voltage based on the integrated value of the phase detection results, and the first current source being configured to generate a current based on an output of the generation circuit.

19. The control method according to claim 15, wherein the frequency-current characteristics are each a gain of the current control oscillator to a frequency.

20. The control method according to claim 15, wherein the integral path is configured to control a frequency in a first frequency range, and the proportional path is configured to control a frequency in a second, higher frequency range.

* * * * *